(12) United States Patent
Breitwisch et al.

(10) Patent No.: US 8,338,225 B2
(45) Date of Patent: Dec. 25, 2012

(54) METHOD TO REDUCE A VIA AREA IN A PHASE CHANGE MEMORY CELL

(75) Inventors: Matthew J. Breitwisch, Essex Junction, VT (US); Eric A. Joseph, White Plains, NY (US); Chung H. Lam, Peekskill, NY (US); Alejandro G. Schrott, New York, NY (US); Yu Zhu, West Harrison, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/350,817

(22) Filed: Jan. 16, 2012

(65) Prior Publication Data
US 2012/0115302 A1      May 10, 2012

Related U.S. Application Data

(62) Division of application No. 12/243,759, filed on Oct. 1, 2008, now Pat. No. 8,101,456.

(51) Int. Cl.
*H01L 21/06* (2006.01)

(52) U.S. Cl. ........................................ 438/102; 438/128

(58) Field of Classification Search .................. 438/102, 438/128
See application file for complete search history.

(56) References Cited

U.S. PATENT DOCUMENTS

| 6,740,921 | B2 * | 5/2004 | Matsuoka et al. | 257/302 |
| 7,384,825 | B2 * | 6/2008 | Park et al. | 438/133 |

* cited by examiner

*Primary Examiner* — Douglas Menz
(74) *Attorney, Agent, or Firm* — Ido Tuchman; Vazken Alexanian

(57) ABSTRACT

A memory cell structure and method to form such structure. The method partially comprised of forming a via within an oxidizing layer, over the center of a bottom electrode. The method includes depositing a via spacer along the sidewalls of the via and oxidizing the via spacer. The via spacer being comprised of a material having a Pilling-Bedworth ratio of at least one and one-half and is an insulator when oxidized. The via area is reduced by expansion of the via spacer during the oxidation. Alternatively, the method is partially comprised of forming a via within a first layer, over the center of the bottom electrode. The first layer has a Pilling-Bedworth ratio of at least one and one-half and is an insulator when oxidized. The method also includes oxidizing at least a portion of the sidewalls of the via in the first layer.

14 Claims, 9 Drawing Sheets

US 8,338,225 B2

METHOD TO REDUCE A VIA AREA IN A PHASE CHANGE MEMORY CELL

CROSS-REFERENCE TO RELATED APPLICATIONS

This application is a divisional application claiming benefit under 35 U.S.C. §120 to the filing date of U.S. patent application Ser. No. 12/243,759 filed Oct. 1, 2008, the entire text of which is specifically incorporated by reference herein.

BACKGROUND

1. Field of the Invention

The present invention relates to forming memory cell structures for phase change memory cells, and, more specifically, a structure with a reduced via area in a phase change memory cell.

2. Description of Background

There are two major groups in computer memory: non-volatile memory and volatile memory. Constant input of energy in order to retain information is not necessary in non-volatile memory but is required in the volatile memory. Examples of non-volatile memory devices are Read Only Memory (ROM), Flash Electrical Erasable Read Only Memory, Ferroelectric Random Access Memory, Magnetic Random Access Memory (MRAM), and Phase Change Memory (PCM); non-volatile memory devices being memory in which the state of the memory elements can be retained for days to decades without power consumption. Examples of volatile memory devices include Dynamic Random Access Memory (DRAM) and Static Random Access Memory (SRAM); where DRAM requires the memory element to be constantly refreshed while SRAM requires a constant supply of energy to maintain the state of the memory element. The present invention is directed to phase change memory. In phase change memory, information is stored in materials that can be manipulated into different phases. Each of these phases exhibit different electrical properties which can be used for storing information. The amorphous and crystalline phases are typically two phases used for bit storage (1's and 0's) since they have detectable differences in electrical resistance. Specifically, the amorphous phase has a higher resistance than the crystalline phase.

Chalcogenides are a group of materials commonly utilized as phase change material. This group of materials contain a chalcogen (Periodic Table Group 16/VIA) and another element. Selenium (Se) and tellurium (Te) are the two most common semiconductors in the group used to produce a chalcogenide when creating a phase change memory cell. An example of this would be Ge2Sb2Te5 (GST), SbTe, and In2Se3.

In phase change memory, the current necessary to drive a change between states in the phase change material is proportionate to the volume of phase change material required for resistance storage. Thus is it desirable to form structures that require smaller volumes of phase change material for resistance storage.

SUMMARY

One aspect of the invention is a method for forming a memory cell structure. The method includes forming a bottom electrode within a substrate. The bottom electrode includes electrode material that is electrically conductive when oxidized. The method also includes depositing an oxide layer over the bottom electrode. The method includes forming a via within the oxide layer and substantially over the center of the bottom electrode. The via includes at least one sidewall. The method includes depositing a via spacer along the at least one sidewall of the via. The method includes oxidizing the via spacer such that the diameter of the via is reduced by expansion of the via spacer during oxidation.

Another aspect of the invention is a method for forming a memory cell structure. The method includes forming an electrically conductive bottom electrode within a substrate. The method includes depositing a first layer over the bottom electrode. The first layer is electrically insulating when oxidized and has a Pilling-Bedworth ratio of at least one and one-half. The method includes forming a via within the first layer and substantially over the center of the bottom electrode. The via includes at least one sidewall. The method includes oxidizing at least a portion of the via sidewall. The diameter of the via is reduced by expansion of the first layer during oxidation. The method also includes depositing a phase change material above the bottom electrode and forming a top electrode above the phase change material.

Yet another aspect of the invention is a memory cell. The memory cell includes a bottom electrode, an oxidized insulator forming a via above the bottom electrode, a phase change material disposed within the via and above the bottom electrode, and a top electrode formed above the phase change material. The oxidized insulator being oxidized and having a Pilling-Bedworth ratio of at least one and one-half.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION

The present invention is described with reference to embodiments of the invention. Throughout the description of the invention reference is made to FIGS. 1-12.

As described below, an aspect of the present invention is a method for forming a memory cell structure for phase change memory. The memory cell structure includes a via. The via can be filled with phase change material or a conductive material that electrically couples the phase change material to a bottom electrode. The method for forming the memory cell structure includes reducing the diameter of the via by oxidizing the sidewalls of the via or via spacers lining the sidewalls of the via. A reduction in the diameter of the via advantageously reduces the current required to melt the phase change material during phase change.

Figure 1:
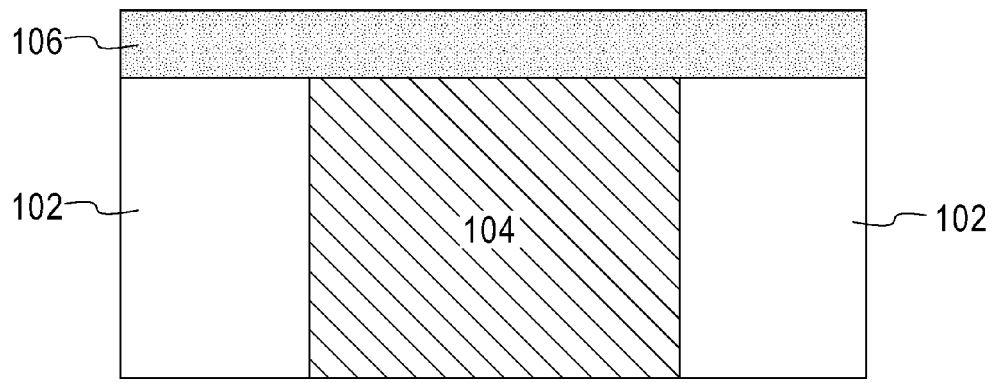
FIG. 1 illustrates a starting substrate contemplated for the present invention.

In FIG. 1, a silicon substrate 102 for an embodiment of the present invention is shown. A bottom electrode 104 is formed within the substrate 102 and an oxidizing layer 106 is formed above the bottom electrode 104. The bottom electrode 104 is comprised of an electrode material that is conductive when it is oxidized. In a particular embodiment of the invention, the oxidizing layer 106 is comprised of a dielectric material. Those skilled in the art will recognize that a variety of methods can be used to form the bottom electrode 104 and the oxidizing layer 106. A reactive-ion etch (RIE) and sputter deposition may be used to form the bottom electrode 104, and a chemical vapor deposition (CVD) may be used to deposit the oxidizing layer 106. A variety of materials may also be utilized for the bottom electrode 104 and for the oxidizing layer 106. In one embodiment of the invention, the bottom electrode 104 is comprised of Ruthenium (Ru) or Tantalum-Ruthenium (TaRu) and the oxidizing layer 106 is comprised of silicon nitride ($SiN_x$). It is contemplated that in one embodiment of the invention, the oxidizing layer 106 is deposited onto a thin insulator layer, and the oxidizing layer 106 is a material with a Pilling-Bedworth ratio of at least one and one-half. The Piling-Bedworth ratio is a ratio at which a material expands when oxidized.

In an alternate embodiment of the invention, a conductive oxide layer (not shown) is formed above the bottom electrode 104 and below the oxidizing layer 106. The conductive oxide layer provides better adhesion for the bottom electrode 104 and allows for the use of a wider range of materials for the bottom electrode without compromising the final electrical contact. A variety of materials that are conductive when oxidized may be utilized for the conductive oxide layer such as Ruthenium (Ru).

Figure 2:
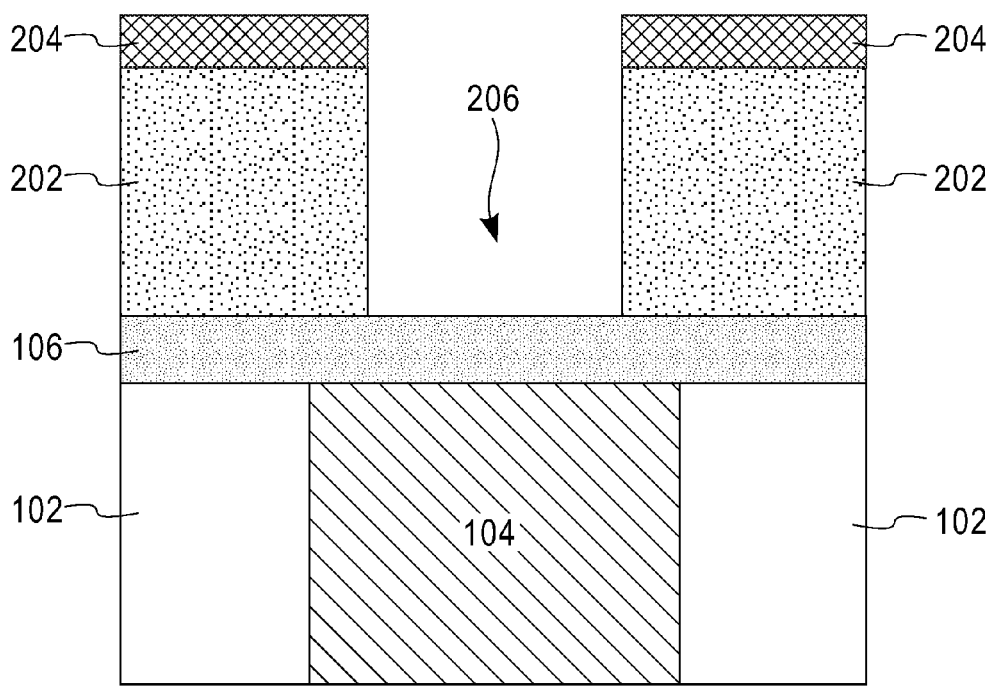
FIGS. 2-6 illustrate a method to form a via in accordance with the present invention.

Now turning to FIGS. 2-5, an embodiment for forming a via above the oxidizing layer 106 is illustrated. In FIG. 2, a sacrificial layer 202 is deposited above the oxidizing layer 106 if the oxidizing layer 106 is silicon-nitride. A nitride layer 204 is deposited above the sacrificial layer 202. A large channel 206 is formed above the bottom electrode within the sacrificial layer 202 and the nitride layer 204. Those skilled in the art will recognize that a photolithographic mask may be utilized for patterning and a directional RIE may be carried out to etch the large channel 206 into the sacrificial layer 202 and the nitride layer 204. The bottom of the large channel 206 is the oxidizing layer 106, as shown. In an alternate embodiment of the invention, the sacrificial layer 202 and the nitride layer 204 may be reversed such that the nitride layer 204 is deposited above the oxidizing layer 106 and the sacrificial layer 202 is deposited above the nitride layer 204 if the sacrificial layer is silicon dioxide ($SiO_2$).

Figure 3:
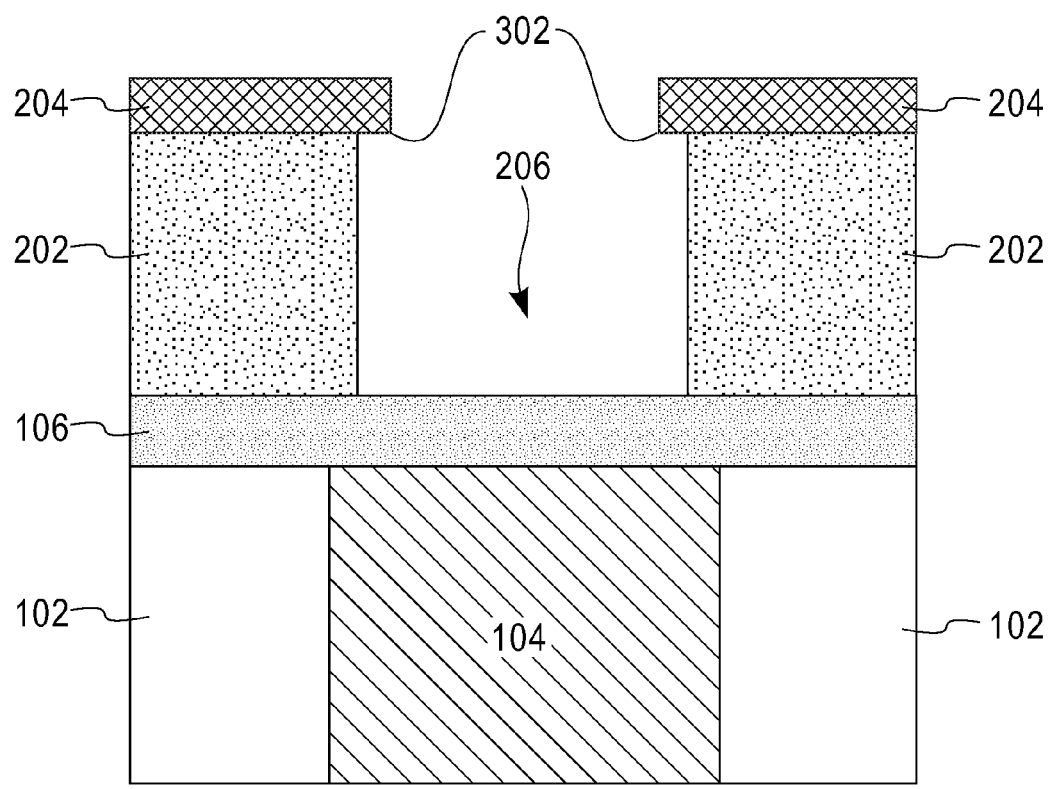

In FIG. 3, an undercut 302 is formed such that the nitride layer 204 overhangs the sacrificial layer 202. A wet dilute hydrofluoric acid etch (DHF) may be utilized to form the undercut 302.

Figure 4:
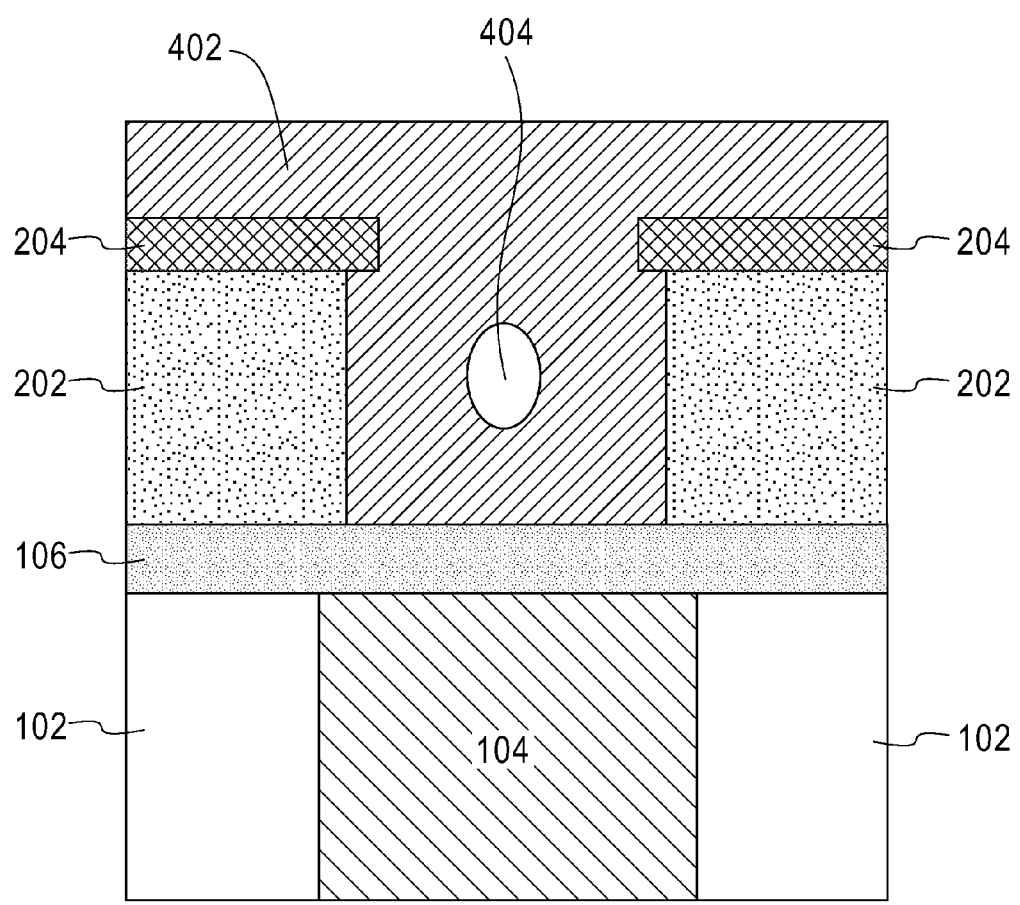

In FIG. 4, a conformal oxide layer 402 is formed above the nitride layer 204 and within the large channel. As a result of the overhang, a small inner channel 404 is formed within the conformal oxide layer 402 in the large channel. The small inner channel 404 has a diameter that is twice the size of the undercut.

Figure 5:
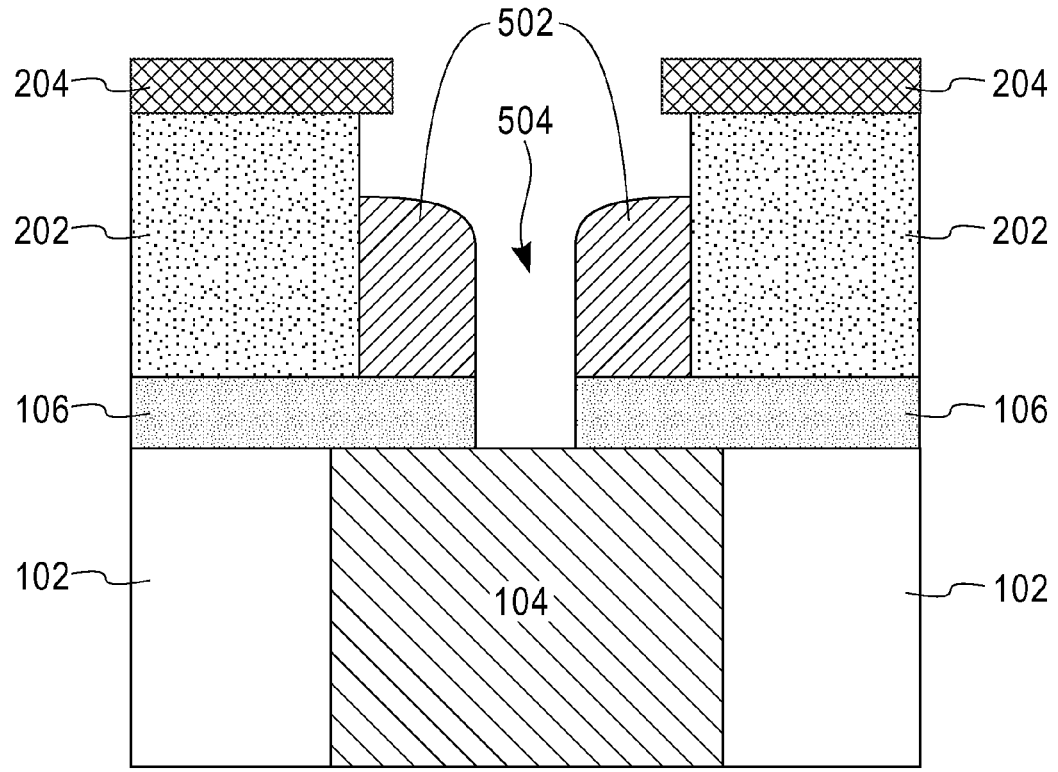

In FIG. 5, an etch is performed such that the conformal oxide layer forms channel spacers 502 within the large channel. A second etch is performed to etch through the oxidizing layer 106, creating a via 504 within the oxidizing layer 106 and substantially over the center of the bottom electrode. Those skilled in the art will recognize that a RIE can be performed for both etches.

Figure 6:
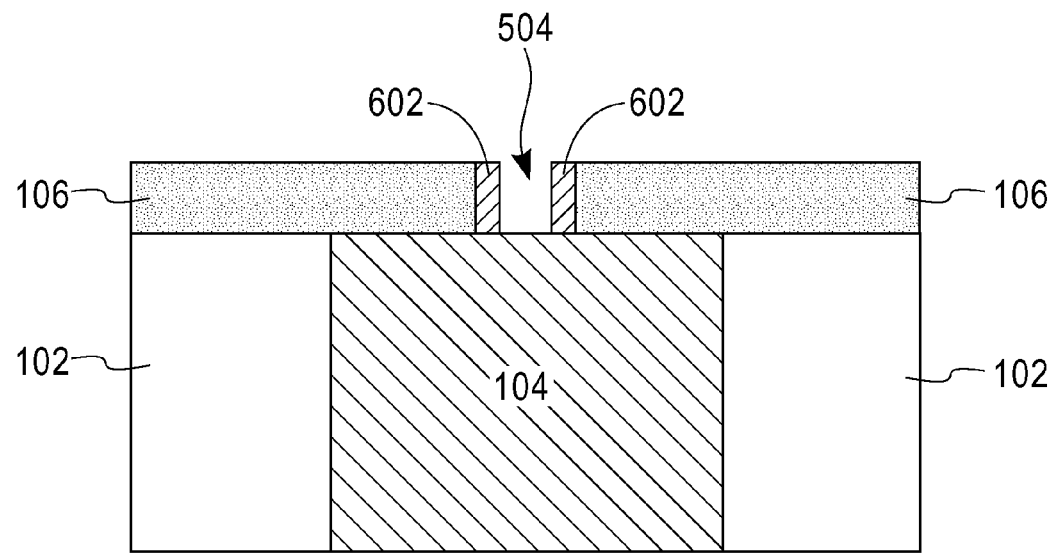

Now turning to FIG. 6, the sacrificial layer, nitride layer, and the channel spacers are removed. A variety of etches may be utilized to selectively remove the layers and channel spacers. A via spacer 602 is then formed on at least one sidewall of the via 504. Those skilled in the art will recognize methods for forming spacers within a via 504, such as a spacer RIE. The via spacer 602 is comprised of a material that has a Pilling-Bedworth ratio of at least one and one-half. In one embodiment of the invention, the via spacer 602 is comprised of Tantalum (Ta).

Figure 7:
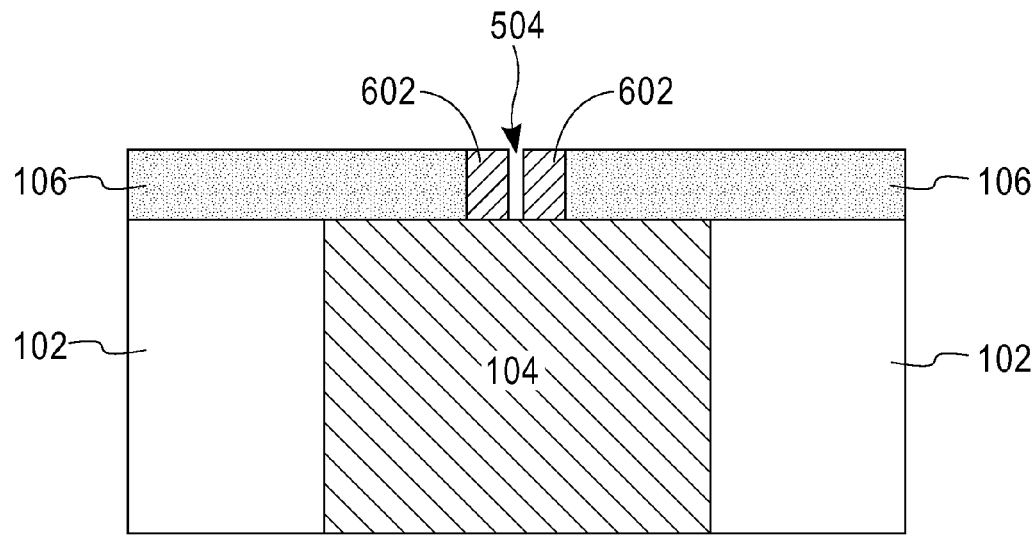
FIG. 7 illustrates an oxidation step contemplated by the invention for reducing the via area.

In FIG. 7, the via spacer 602 is oxidized. When the via spacer 602 is oxidized the material expands and the diameter of the via 504 is reduced. In an embodiment of the invention, the via spacer 602 is an oxidized insulator. Those skilled in the art will recognize that a variety of processes may be utilized in oxidizing the via spacer 602 such as an oxygen plasma.

Figure 8:
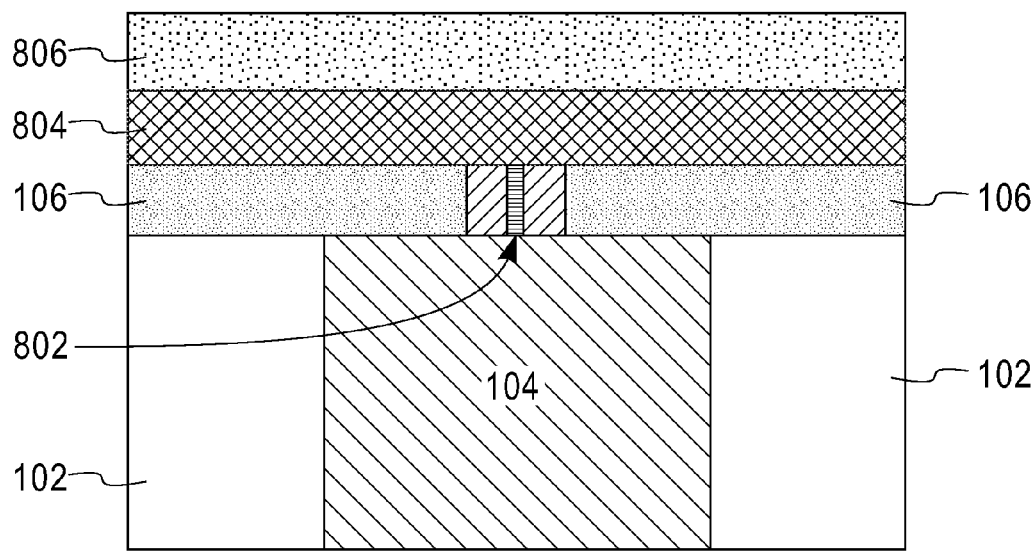
FIG. 8 illustrates phase change material and top electrode deposition.

In FIG. 8, the via is filled with a via conductor 802. A process such as CVD may be used to fill the via with the via conductor 802, and the excess may be removed using Chemical mechanical polishing (CMP). Phase change material 804 is deposited above the via conductor 802 and a top electrode 806 is formed above the phase change material 804. A variety of phase change materials 804 that can be set to at least two separate resistive states may be utilized, such as Germanium-Antimony-Tellurium (GST). Additionally, a variety of conductive materials may be used for the top electrode 806, such as Titanium-Nitride (TiN). Those skilled in the art will recognize that a variety of processes may be utilized to deposit the phase change material 804 and the top electrode 806, such as CVD and sputter deposition. Additionally, a variety of phase change material geometries may be employed. FIG. 8 is only one embodiment of a memory cell. Those skilled in the art will recognize that a variety of memory cell geometries may be employed without departing from the spirit and scope of the invention.

Figure 9:
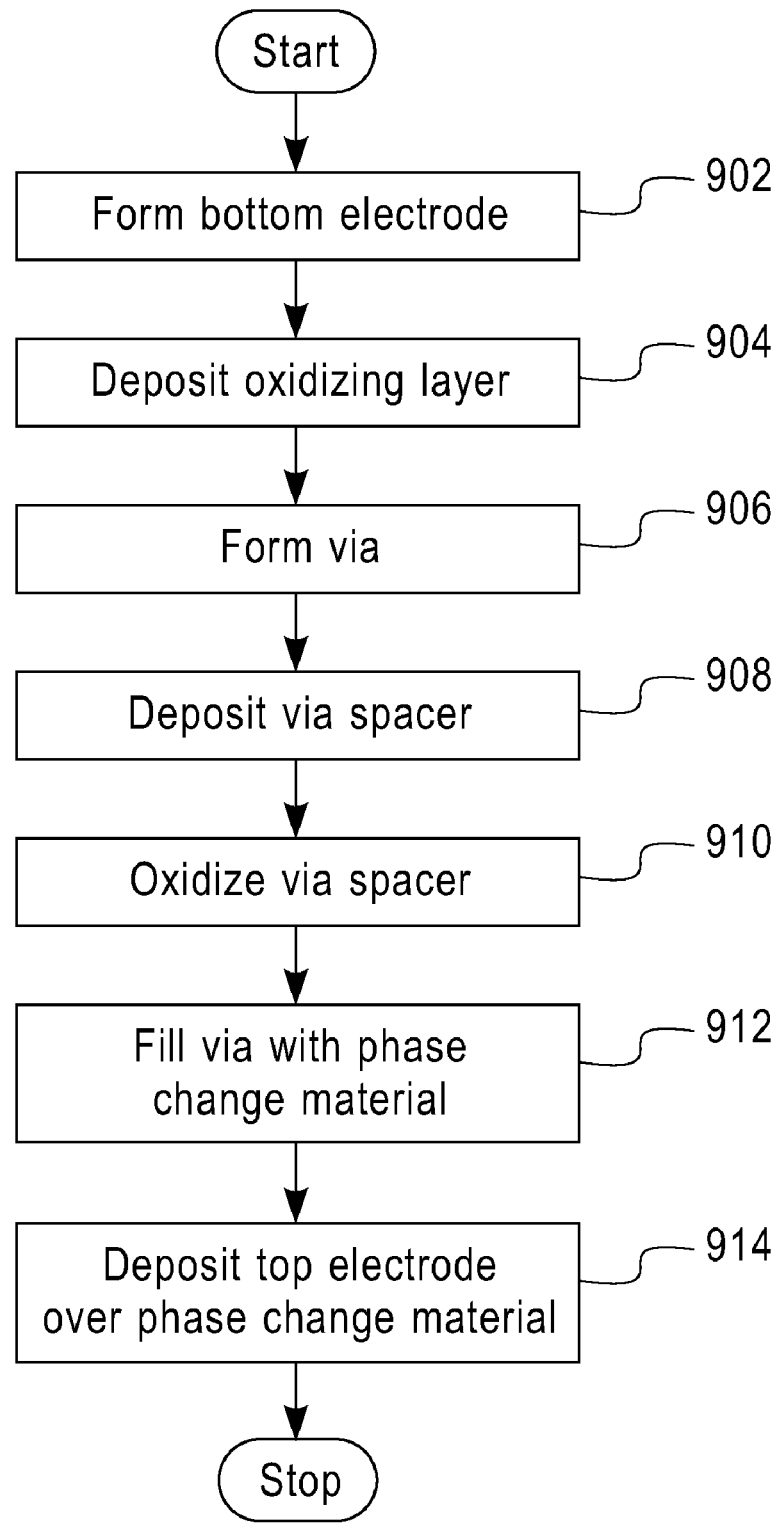
FIG. 9 shows a method for forming a memory cell structure in accordance with the present invention.

Now turning to FIG. 9, one embodiment of the method for forming a memory cell structure contemplated by the present invention is illustrated in a flowchart. The method begins at forming step 902. At forming step 902, the bottom electrode is formed in the substrate. As stated above, the bottom electrode may be comprised of a variety of materials that are conductive when oxidized. Examples of such materials include Pd and TaRu. After forming step 902 is completed, the method continues to depositing step 904.

At depositing step 904, an oxidizing layer is formed above the bottom electrode. A variety of processes may be used such as CVD and plasma-enhanced chemical vapor deposition (PECVD). The oxidizing layer may be comprised of a variety of dielectric materials such as $SiN_x$ and $SiO_2$. After depositing step 904 is completed, the method continues to forming step 906.

At forming step 906, a via is formed in the oxidizing layer above the bottom electrode. A variety of methods may be employed to form the via, as detailed above. After forming step 906 is completed, the method continues to depositing step 908.

At depositing step 908, a via spacer is deposited into the via. The via spacer is formed along at least one sidewall of the via. A variety of processes may be used to deposit the via spacer. An example is CVD for deposition of the material and a directional RIE for the formation of the via spacer. The via spacer is comprised of a material that has a Pilling-Bedworth ratio of at least one and one-half. Examples of such materials are Ta, W, and Vanadium (V). After depositing step 908, the method continues to oxidizing step 910.

At oxidizing step 910, the via spacer is oxidized. The via spacer expands and the critical dimension of the via is reduced. A variety of oxidization processes may be used such as an oxygen plasma. After the oxidizing step 910 is completed, the method proceeds to filling step 912. At filling step 912, the via is filled with phase change material and the excess is removed by means of CMP. As described above, a variety of processes and materials may be utilized for filling step 912. After filling step 912 is completed, the method continues to depositing step 914.

At depositing step 914, a top electrode is deposited above the phase change material. Again, a variety of conductive materials and processes may be utilized for depositing step 914. The method ends after completion of depositing step 914.

Figure 10:
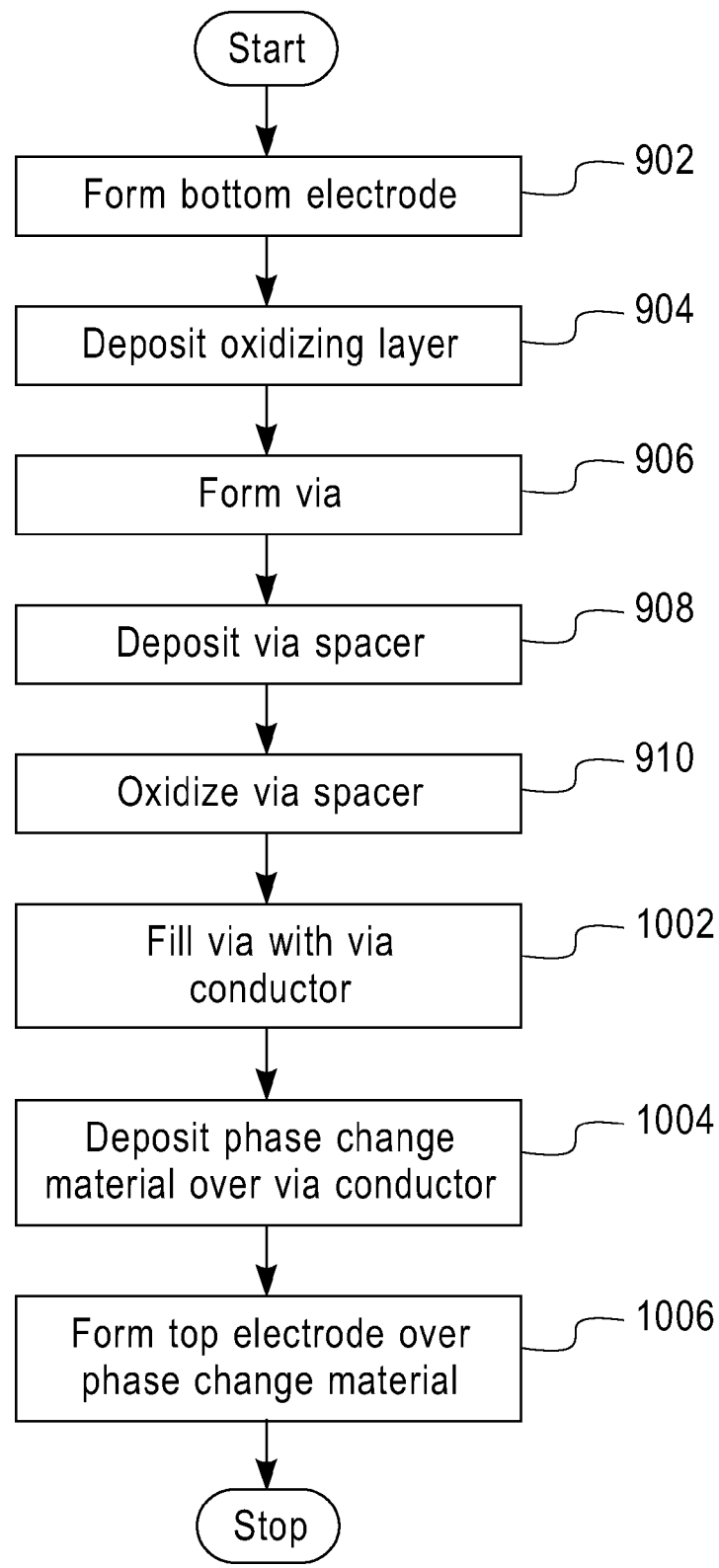
FIG. 10 shows another method for forming a memory cell structure in accordance with the present invention.

FIG. 10 shows another embodiment of a method for forming a memory cell structure in accordance with the present invention. This embodiment also may include steps 902, 904, 906, 908, and 910. After oxidizing step 910, the method continues to filling step 1002. At filling step 1002, the via is filled with a via conductor. The via conductor electrically couples the bottom electrode to the phase change material, and is comprised of a conductive material. A variety of processes and materials may be employed for filling step 1002, as discussed above. After filling step 1002 is completed, the method continues to depositing step 1004.

At depositing step 1004, phase change material is deposited over the via conductor. Those skilled in the art will recognize that a variety of phase change geometries may be utilized. Additionally, as described above, a variety of processes and phase change materials may be used for depositing step 1004. After depositing step 1004 is completed, the method continues to forming step 1006.

At forming step 1006, a top electrode is forming above the phase change material. As described above, a variety of processes and conductive materials may be used for forming step 1106. After forming step 1006 is completed, the method ends.

Figure 11:
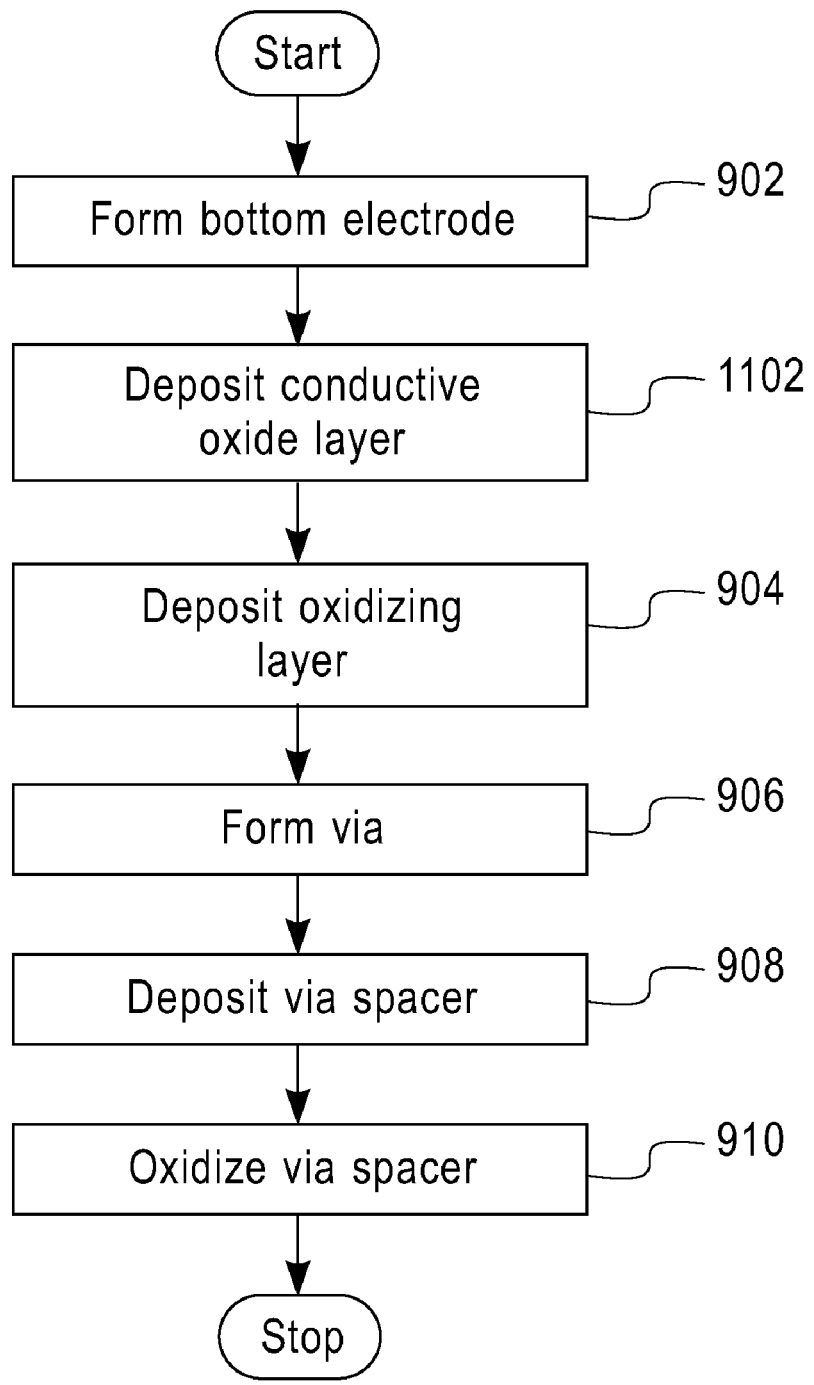
FIG. 11 shows yet another method for forming a memory cell structure in accordance with the present invention.

Now turning to FIG. 11, yet another embodiment of the method for forming a memory cell structure in accordance with the present invention is shown. In this particular embodiment, forming step 902 proceeds to depositing step 1102. At depositing step 1102, a conductive oxide layer is deposited above the bottom electrode. The conductive oxide layer is comprised of a material that is conductive when oxidized and provides better adhesion at the bottom electrode and allows for the use of a wider range of materials for the bottom electrode without compromising the final electrical contact. An example of such a material is Ru if the bottom electrode is comprised of TiN or W. After depositing step 1102 is completed, the method continues to depositing step 904 and proceeds as described above with reference to FIG. 9.

Figure 12:
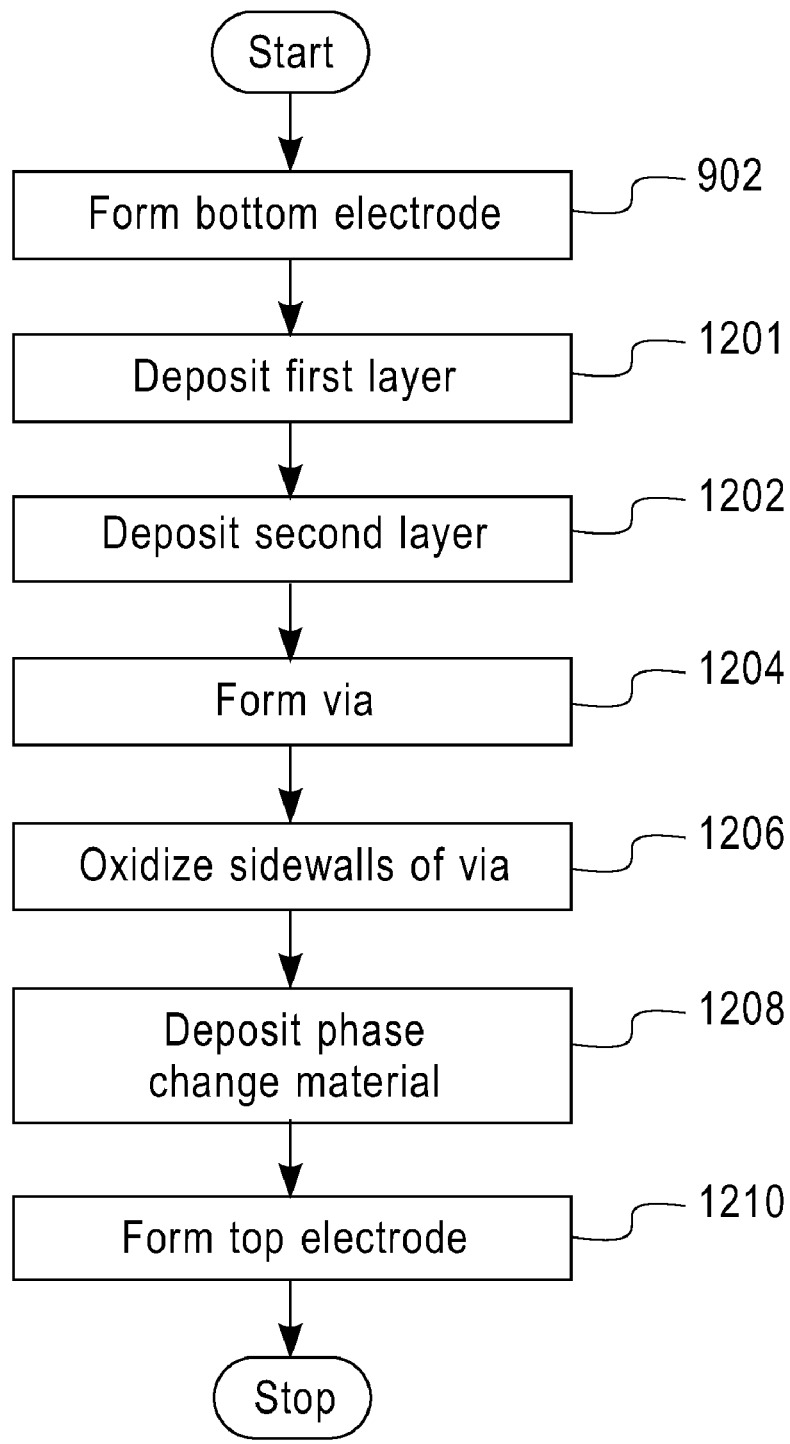
FIG. 12 shows a further method for forming a memory cell structure in accordance with the present invention.

In FIG. 12, an alternate embodiment of the method for forming a memory cell structure in accordance with the present invention is illustrated. As in the embodiment detailed with respect to FIG. 9, the method begins with forming step 902. At depositing step 1201, a first layer of insulator material is applied on the bottom electrode The method then proceeds to depositing step 1202 after the completion of forming step 902. At depositing step 1202, a second layer of a material that has a Pilling-Bedworth ratio of at least one and one-half is deposited above first layer. As described above, a variety of processes and materials may be utilized for depositing step 1202. Additionally, a conductive oxide layer may be deposited above the bottom electrode layer and below the first layer to provide a better contact. After depositing step 1202 is completed, the method continues to forming step 1204.

At forming step 1204, a via is formed in the first and second layers. A variety of processes may be utilized to form the via, such as mask formation (photolithographic or the processes detailed above) and directional RIE. After forming step 1204, the method continues to oxidizing step 1206.

At oxidizing step 1206, the at least a portion of the sidewalls of the via are oxidized. During oxidizing step 1206, the critical diameter of the via formed in the second layer is reduced. A variety of processes such as an oxygen plasma may be used for oxidizing the sidewalls. After oxidizing step 1206, the method continues to depositing step 1208.

At depositing step 1208, phase change material is deposited above the bottom electrode. Again, a variety of processes and materials may be utilized for depositing step 1208. As discussed above, in another embodiment of the invention a via conductor may alternatively be deposited in the via. After depositing step 1208, the method proceeds to forming step 1210.

At forming step 1210, a top electrode is formed above the phase change material. A variety of processes and materials may be utilized for forming step 1210. After the completion of depositing step 1210 is completed, the method ends.

Having described preferred embodiments for the method for forming a memory cell structure (which are intended to be illustrative and not limiting), it is noted that modifications and variations can be made by persons skilled in the art in light of the above teachings. It is therefore to be understood that changes may be made in the particular embodiments disclosed which are within the scope and spirit of the invention as outlined by the appended claims. Having thus described aspects of the invention, with the details and particularity required by the patent laws, what is claimed and desired protected by Letters Patent is set forth in the appended claims.

What is claimed is:

1. A method for forming a memory cell structure, the method comprising:

forming a bottom electrode within a substrate, the bottom electrode being electrically conductive;

depositing a first layer over the bottom electrode, the first layer having a Pilling-Bedworth ratio of at least one and one-half;

depositing a sacrificial layer and a nitride layer over the first layer;

etching a channel in the sacrificial layer such that a nitride layer overhang is formed above the sacrificial layer;

depositing a conformal layer within the channel such that a void is formed within the conformal layer as a result of the nitride layer overhang;

etching through the conformal layer and the void such that a via is formed within the first layer and substantially over the center of the bottom electrode, the via including at least one sidewall;

oxidizing at least a portion of the at least one sidewall of the via such that the diameter of the via is reduced by expansion of the first layer;

depositing a phase change material above the bottom electrode; and forming a top electrode above the phase change material.

2. The method of claim 1, wherein the bottom electrode is electrically conductive when oxidized.

3. The method of claim 1, further comprising filling the via with an electrically conductive material after oxidizing at least a portion of the sidewalls of the via.

4. The method of claim 1, further comprising filling the via with the phase change material after oxidizing at least a portion of the sidewalls of the via.

5. The method of claim 1, wherein the bottom electrode forms the bottom of the via and is electrically conductive when oxidized.

6. The method of claim 1, wherein forming the bottom electrode includes depositing a conductive oxide layer on a proximate end of the bottom electrode, the conductive oxide layer being electrically conductive when oxidized.

7. The method of claim 6, wherein the conductive oxide layer is Ruthenium-Oxide.

8. The method of claim 1, wherein the first layer is comprised of Tantalum (Ta).

9. The method of claim 1, wherein oxidizing at least a portion of the sidewalls of the via includes reducing tapering in the via.

10. The method of claim 1, wherein the inside of the via contains no portion of the bottom electrode.

11. The method of claim 1, further comprising:
    filling the via with phase change material after oxidizing the via spacer; and
    forming a top electrode over the phase change material.

12. The method of claim 1, further comprising filling the via with a via conductor, the via conductor comprising an electrically conductive material.

13. The method of claim 12, further comprising:
    depositing phase change material above the via conductor; and
    forming a top electrode over the phase change material.

14. The method of claim 1, wherein oxidizing the at least one sidewall is performed after forming the via within the first layer.

* * * * *